US010782330B2

(12) United States Patent
Mori

(10) Patent No.: US 10,782,330 B2
(45) Date of Patent: Sep. 22, 2020

(54) SEMICONDUCTOR INTEGRATED CIRCUIT AND SIGNAL PROCESSING METHOD

(71) Applicant: SONY CORPORATION, Tokyo (JP)

(72) Inventor: Shigetaka Mori, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 37 days.

(21) Appl. No.: 16/069,779

(22) PCT Filed: Jan. 20, 2017

(86) PCT No.: PCT/JP2017/001851
§ 371 (c)(1),
(2) Date: Jul. 12, 2018

(87) PCT Pub. No.: WO2017/135061
PCT Pub. Date: Aug. 10, 2017

(65) Prior Publication Data
US 2019/0049498 A1 Feb. 14, 2019

(30) Foreign Application Priority Data
Feb. 1, 2016 (JP) .................................. 2016-017541

(51) Int. Cl.
*G01R 27/26* (2006.01)
*G01R 27/02* (2006.01)
(Continued)

(52) U.S. Cl.
CPC .......... *G01R 27/2605* (2013.01); *G01N 27/22* (2013.01); *G01R 27/02* (2013.01);
(Continued)

(58) Field of Classification Search
CPC .. G01R 27/2605; G01R 31/028; G01R 27/02; G01R 31/001; G01R 29/24; G01R 31/016; G01R 31/2822; G01R 31/2853
(Continued)

(56) References Cited

U.S. PATENT DOCUMENTS 6,300,765 B1 10/2001 Chen
2003/0117151 A1* 6/2003 Kunikiyo .......... H01L 21/82380
324/658
(Continued)

FOREIGN PATENT DOCUMENTS

CN 104169728 A 11/2014
EP 2795350 B1 10/2014
(Continued)

OTHER PUBLICATIONS

Groeseneken, et al., "A Reliable Approach to Charge-Pumping Measurements in MOS Transistors", IEEE Transactions on Electron Devices, vol. ED.31, No. 1, Jan. 1984, p. 42-53.
(Continued)

*Primary Examiner* — Raul J Rios Russo
(74) *Attorney, Agent, or Firm* — Chip Law Group

(57) ABSTRACT

The present disclosure relates to a semiconductor integrated circuit and a signal processing method that can improve measurement accuracy. Pulses subjected to pulse generation and disconnection control by a control circuit are supplied to a pulse distribution circuit and a CP circuit. The pulse distribution circuit divides one pulse into two or more pulses that do not overlap each other, and supplies the pulses to a CBCM circuit. The CBCM circuit is configured by connecting a capacitance element to be measured to the output of a measurement core circuit called a pseudo inverter. The CP circuit inputs, to the gate electrode, pulses that cause a channel of a non-measurement MISFET to change from the accumulation state to the inverted state, and monitors, from the substrate side, a CP current flowing through a trap acting as a recombination center of the gate insulating film and the semiconductor substrate interface. The present disclosure can be applied to, for example, a semiconductor integrated
(Continued)

circuit for evaluating the characteristics of the gate insulating film of the MISFET.

12 Claims, 13 Drawing Sheets

(51) Int. Cl.
    *G01R 31/00*     (2006.01)
    *G01R 29/24*     (2006.01)
    *G01R 31/01*     (2020.01)
    *G01R 31/28*     (2006.01)
    *G01N 27/22*     (2006.01)
    *H03K 5/15*     (2006.01)

(52) U.S. Cl.
    CPC ........... *G01R 29/24* (2013.01); *G01R 31/001* (2013.01); *G01R 31/016* (2013.01); *G01R 31/2822* (2013.01); *G01R 31/2853* (2013.01); *H03K 5/15* (2013.01)

(58) Field of Classification Search
    USPC .... 324/76.11, 459, 600, 649, 658, 676, 678, 324/710
    See application file for complete search history.

(56) References Cited

U.S. PATENT DOCUMENTS

| | | | | |
|---|---|---|---|---|
| 2003/0218473 A1* | 11/2003 | Yamashita | ........... | G01R 31/275 324/750.3 |
| 2004/0008051 A1 | 1/2004 | Ohkawa et al. | | |
| 2008/0258998 A1* | 10/2008 | Miyake | .................... | H03K 3/36 345/42 |
| 2013/0307604 A1* | 11/2013 | Miyake | ................ | G11C 19/184 327/291 |
| 2013/0322592 A1* | 12/2013 | Miyake | ................ | G11C 19/184 377/64 |
| 2014/0372057 A1 | 12/2014 | Van Der Plas et al. | | |
| 2014/0374760 A1* | 12/2014 | Miyake | .................. | G11C 19/00 257/59 |

FOREIGN PATENT DOCUMENTS

| | | |
|---|---|---|
| JP | 2004-028619 A | 1/2004 |
| JP | 2016-092076 A | 5/2016 |
| TW | 200403782 A | 11/2004 |
| TW | 201326836 A | 7/2013 |
| WO | 2013/091909 A1 | 6/2013 |

OTHER PUBLICATIONS

Chen, et al., "An On-Chip, Attofarad Interconnect Charge-Based Capacitance Measurement (CBCM) Technique", 6 pages.

Sawada, et al, "In-Line Monitoring Test Structure for Charge-Based Capacitance Measurement (CBCM) with a Start-Stop Self-Pulsing Circuit", Proceedings of the 2015 IEEE International Conference on Microelectronic Test Structures, Mar. 23-26, 2015, pp. 145-149.

Mori, et al., "Monitoring Test Structure for Plasma Process Induced Charging Damage using Charge-Based Capacitance Measurement (PID-CBCM)", Proceedings of the 2015 IEEE International Conference on Microelectronic Test Structures, Mar. 23-26, 2015, pp. 132-137.

Mori, et al.,"Highly Effective and Versatile Test Structure for Evaluating Dielectric Properties using Flexible Pulse Generator on Chip", 29th IEEE International Conference on Microelectronic Test Structures Conference Proceedings, Mar. 28-31, 2016, pp. 106-109.

Chang, et al., "A Novel Simple CBCM Method Free from Charge Injection-Induced Errors", IEEE Device Letters, vol. 25, No. 5, May 2004, pp. 262-264.

Chen, et al., "An On-Chip, Attofarad Interconnect Charge-Based Capacitance Measurement (CBCM) Technique", International Electron Devices Meeting, 1996, 06 pages.

International Search Report and Written Opinion of PCT Application No. PCT/JP2017/001851, dated Apr. 11, 2017, 10 pages of ISRWO.

* cited by examiner

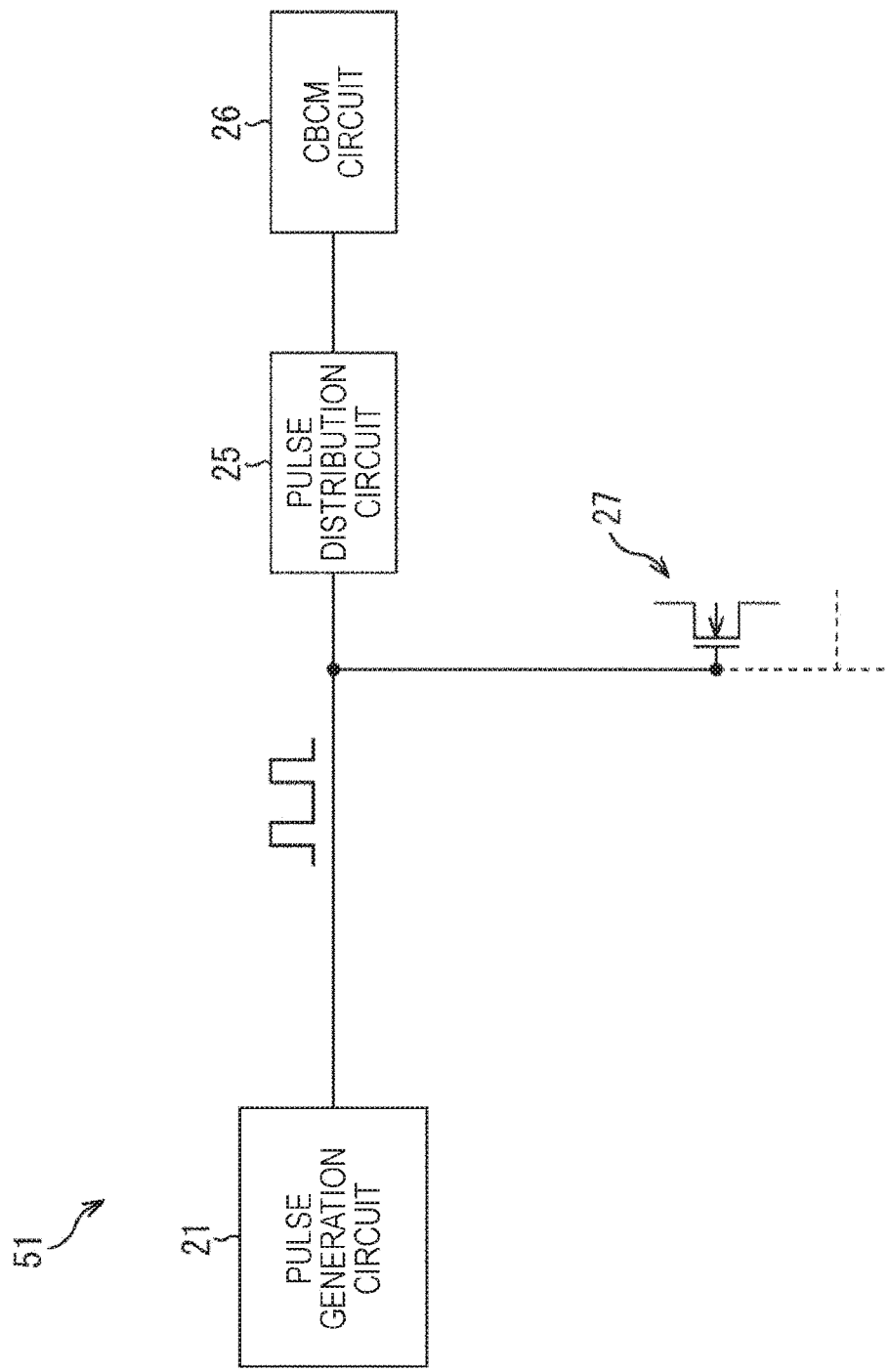

SEMICONDUCTOR INTEGRATED CIRCUIT AND SIGNAL PROCESSING METHOD

CROSS REFERENCE TO RELATED APPLICATIONS

This application is a U.S. National Phase of International Patent Application No. PCT/JP2017/001851 filed on Jan. 20, 2017, which claims priority benefit of Japanese Patent Application No. JP 2016-017541 filed in the Japan Patent Office on Feb. 1, 2016. Each of the above-referenced applications is hereby incorporated herein by reference in its entirety.

TECHNICAL FIELD

The present disclosure relates to a semiconductor integrated circuit and a signal processing method, and in particular to a semiconductor integrated circuit and a signal processing method that can improve measurement accuracy.

BACKGROUND ART

A charge-based capacitance measurement method (hereinafter referred to as the CBCM method) and a charge pumping method (hereinafter referred to as the CP method) are well known as effective methods for evaluating the characteristics of the gate insulating film of a MISFET.

The CBCM method is characterized by being able to measure a very small capacitance, and was originally developed as a method for measuring a very small capacitance between metal wires. The CBCM method is also known as an effective method for gate insulating film capacitance measurement in advanced processes (see Non-Patent Document 1). The CP method is well known as an effective method for calculating the interface state density due to defects generated in the process step at the gate insulating film and the semiconductor substrate interface, and the process controllability of the gate insulating film generating step can be monitored using the interface state density calculated with the CP method (see Non-Patent Document 2). A common feature of the CBCM method and CP method is the necessity of pulse input.

In addition, in the CP method, pulses that cause a channel of the MISFET to change from the accumulation state to the inverted state are input to the gate electrode, and a charge pumping current flowing through a trap acting as a recombination center of the gate insulating film and the semiconductor substrate interface is monitored from the substrate side. Input pulses are often supplied from an external pulse generator (hereinafter referred to as a generator) for measurement. In some reported cases, however, a ring oscillator (hereinafter referred to as RO) is mounted on the same substrate as the MISFET to be measured, and pulses are supplied from an internal circuit for measurement.

The maximum output pulse frequency of generally used generators is about several megahertz to several tens of megahertz. Therefore, it is difficult to measure low frequency capacitance due to gate leakage in the evaluation of a very thin gate insulating film in advanced processes, causing concern that it will become increasingly difficult to secure the accuracy of capacitance measurement in the future.

In addition, since a standard mass-production line measuring system (in-line tester) is not equipped with a generator, it is difficult to apply the CBCM method or CP method to mass production at all times. In this regard, if RO is mounted on the same semiconductor substrate, the need for a generator may be eliminated, and it may be possible to apply the CBCM method and the CP method to mass production.

CITATION LIST

Non-Patent Document

Non-Patent Document 1: J. C. Chen, B. W. McGaughy, D. Sylvester, and C. Hu, "An on-chip attofarad interconnect charge-based capacitance measurement (CBCM) technique," in IEDM Tech. Dig., 1996, pp. 3.4.1-3.4.4./Yao-Wen Chang, Hsing-Wen Chang, Chung-Hsuan Hsieh, Han-Chao Lai, Tao-Cheng Lu, Wenchi Ting, Joseph Ku, and Chih-Yuan Lu, "A Novel Simple CBCM Method Free From Charge Injection-Induced Errors" in IEEE ELECTRON DEVICE LETTERS, VOL. 25, NO. 5, MAY 2004 pp. 262-264

Non-Patent Document 2: G. Groeseneken, H. E. Meas, N. Beltran, and R. T. DeKeersmaecher, "A Reliable Approach to Charge-Pumping Measurements in MOS Transistors," IEEE Trans. Electron. Dev., Vol. ED-31, pp. 42-53, 1984.

SUMMARY OF THE INVENTION

Problems to be Solved by the Invention

However, since the CBCM method and the CP method do not necessarily have the same optimum frequency, RO may be required for each of the CBCM method and the CP method. Therefore, the mounting area increases, and the number of measured PADs increases.

The present disclosure has been made in consideration of the above-mentioned circumstances, so that measurement accuracy can be improved.

Solutions to Problems

A semiconductor integrated circuit according to an aspect of the present technology includes: a pulse generation circuit capable of frequency modulation; at least one of: at least one or more charge-based capacitance measurement (CBCM) circuits; and at least one or more difference CBCM (DCBCM) circuits, the CBCM circuit and the DCBCM circuit being preceded by a circuit that causes an output pulse from the pulse generation circuit to branch into at least two or more pulses that do not overlap with each other, the CBCM circuit and the DCBCM circuit receiving branch input of the output pulse from the pulse generation circuit; and at least one or more non-measurement metal insulator semiconductor field effect transistors (MISFETs) having a gate electrode that receives branch input of the output pulse from the pulse generation circuit.

The pulse generation circuit, the circuit, and the non-measurement MISFET are formed on the same semiconductor substrate.

Further provided are: a control circuit that controls generation and disconnection of a certain number of pulses using a reference pulse input from the outside as a trigger; and a phase locked loop (PLL) circuit or a digital locked loop (DLL) circuit that performs phase synchronization on the reference pulse.

Further provided is a switch that switches between DC voltage from a DC voltage application terminal and pulse input from the pulse generation circuit.

In a case where the CBCM circuit is provided, in the CBCM circuit, after branching into at least three or more pulses that do not overlap with each other in a former stage circuit, one of the pulses is input to a PMISFET of a pseudo inverter, one of the pulses is input to an NMISFET of the pseudo inverter, and one of the pulses is input to a counter electrode of a measurement target capacitor.

In a case where the DCBCM circuit is provided, in the DCBCM circuit, after branching into four pulses that do not overlap each other in a former stage circuit, the pulses are input to two charge/discharge input terminals and two gate electrodes in a controllable manner.

In a case where a charge pumping current is measured in a gate insulating film of the non-measurement MISFET, a well of the gate insulating film is separated from a drain and a source, and separated from wells of at least the pulse generation circuit, the control circuit, and the circuit.

In the non-measurement MISFET, a drain, a source, and a well terminal are separated.

The pulse generation circuit can include a ring oscillator circuit.

When measuring a charge pumping current of the non-measurement MISFET, the charge pumping current is measured by making a well voltage of the non-measurement MISFET larger than a gate pulse voltage to control an effective gate voltage to a negative voltage.

A signal processing method according to an aspect of the present technology includes, by a signal processing circuit: branch-inputting an output pulse from a pulse generation circuit capable of frequency modulation to at least one of: at least one or more CBCM circuits; and at least one or more DCBCM circuits, the CBCM circuit and the DCBCM circuit being preceded by a circuit that causes the output pulse from the pulse generation circuit to branch into at least two or more pulses that do not overlap with each other; and branch-inputting the output pulse from the pulse generation circuit to at least one or more non-measurement MISFETs having a gate electrode.

According to an aspect of the present technology, an output pulse from a pulse generation circuit capable of frequency modulation is branch-input to at least one of: at least one or more CBCM circuits; and at least one or more DCBCM circuits. The CBCM circuit and the DCBCM circuit are preceded by a circuit that causes the output pulse from the pulse generation circuit to branch into at least two or more pulses that do not overlap with each other. Then, the output pulse from the pulse generation circuit is branch-input to at least one or more non-measurement MISFETs having a gate electrode.

Effects of the Invention

According to the present technology, measurement accuracy can be improved.

Note that the effects described in the present specification are merely examples, and the effects of the present technology are not limited to the effects described in the present specification. Any additional effect may also be obtained.

BRIEF DESCRIPTION OF DRAWINGS

FIG. 4 is a block diagram illustrating another configuration example of a semiconductor integrated circuit according to the present technology.

MODE FOR CARRYING OUT THE INVENTION

Hereinafter, modes for carrying out the present disclosure (hereinafter referred to as "embodiments") will be described.

Signal Processing Circuit of the Present Technology

Figure 1:
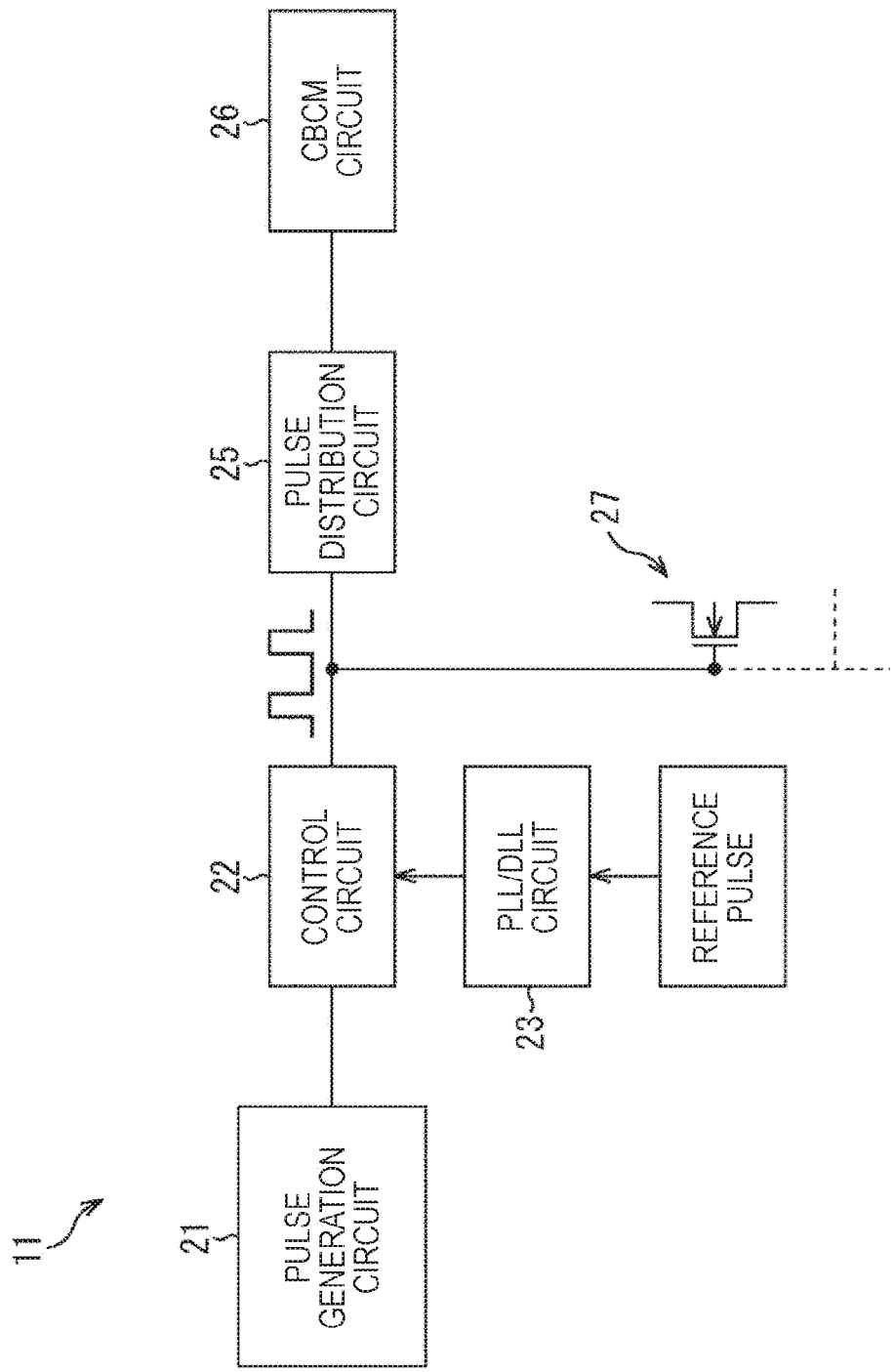
FIG. 1 is a block diagram illustrating a configuration example of a semiconductor integrated circuit to which the present technology is applied.

FIG. 1 is a block diagram illustrating a configuration example of a semiconductor integrated circuit to which the present technology is applied. The circuit of the example of FIG. 1 is a comprehensive evaluation circuit for a gate insulating film in which the charge-based capacitance measurement (CBCM) method and the charge pumping (CP) method are realized in the same circuit system.

The semiconductor integrated circuit 11 of FIG. 1 includes a pulse generation circuit 21, a control circuit 22, a PLL/DLL circuit 23, a pulse distribution circuit 25, a CBCM circuit 26, and a CP circuit 27.

The pulse generation circuit 21 includes, for example, a ring oscillator (RO), and is capable of frequency modulation. The pulse generation circuit 21 generates pulses and supplies the generated pulses to the control circuit 22. The control circuit 22 controls the generation and disconnection of a certain number of pulses using a reference pulse synchronized in phase by the PLL/DLL circuit 23 as a trigger. The phase locked loop (PLL)/digital locked loop (DLL) circuit 23 performs phase synchronization on a reference pulse input from the outside, and inputs the reference pulse synchronized in phase to the control circuit 22.

Pulses subjected to pulse generation and disconnection control by the control circuit 22 are supplied to the pulse distribution circuit 25 and the CP circuit 27. The pulse distribution circuit 25 divides one pulse into two or more non-overlapping pulses, and supplies the pulses to the CBCM circuit 26.

The CBCM circuit 26 is configured by connecting a capacitance element to be measured to the output of a measurement core circuit called a pseudo inverter. The CBCM circuit 26 measures capacitance (e.g., gate capacitance or capacitance between wires).

The CP circuit 27 inputs, to the gate electrode, pulses that cause a channel of a non-measurement metal insulator semiconductor field effect transistor (MISFET) to change from the accumulation state to the inverted state, and monitors, from the substrate side, a CP current flowing through a trap acting as a recombination center of the gate insulating film and the semiconductor substrate interface. The CP circuit 27 monitors (measures) the charge pumping current. As will be described later with reference to FIG. 6, the CP circuit 27 can also measure the gate voltage-drain current characteristic at the time of DC voltage application (hereinafter referred to as VgId) and VgId at the time of pulse application (hereinafter referred to as Pulsed VgId). It should be noted that the charge pumping current and VgId can also be measured by the CBCM circuit 26.

In the semiconductor integrated circuit 11 configured as described above, the pulse generation circuit 21 is formed on the same semiconductor substrate as the gate insulating film to be measured, and the frequency is variable. Therefore, pulses can be supplied from one pulse generation circuit 21 even in a case where the CBCM method and the CP method have different optimum frequencies. That is, the CBCM method and the CP method can be simultaneously realized, and the comprehensive evaluation of the gate insulating film can be performed just with the circuit of the present technology.

Further, since the semiconductor integrated circuit 11 is equipped with the control circuit 22, the CBCM method can be implemented without measuring the frequency of pulses supplied from the pulse generation circuit 21. Specifically, in a case where an internal pulse generation circuit is installed, the oscillation frequency normally needs to be measured with an external measuring instrument. However, since most mass-production line measuring systems are not equipped with frequency measuring instruments, it is difficult to perform frequency measurement at all times during mass production. However, this control circuit 22 eliminates the need to measure the oscillation frequency from the outside.

Further, the CBCM method for the semiconductor integrated circuit 11 does require two pulses that never overlap with each other. In this regard, the semiconductor integrated circuit 11 is equipped with the pulse distribution circuit 25 that causes one pulse supplied from the pulse generation circuit 21 to branch into two or more non-overlapping pulses. It is desirable that the pulse distribution circuit 25 be arranged close to the CBCM circuit 26. This makes it possible to perform control during high-frequency measurement such that two or more pulses, which are difficult to control when using an external pulse generator, do not overlap each other.

Furthermore, the CP method for the semiconductor integrated circuit 11 can be realized even with internal pulses by applying a DC bias to the substrate side of the measured gate insulating film in a controllable manner. Specifically, in the CP method, it is necessary to cause transition from the accumulation state to the inverted state at the time of inputting a single pulse, that is, input of a pulse that changes from a negative voltage to a positive voltage is necessary. However, it is difficult for an internal circuit to generate such a pulse. On the other hand, in the present technology, when a positive voltage pulse is applied, the substrate side voltage is controlled such that a voltage larger than the pulse voltage is applied, whereby a negative voltage can be effectively applied to the gate insulating film. By forming the pulse generation circuit 21, the control circuit 22, and the pulse distributor 25 on the same semiconductor substrate as the gate insulating film to be measured, the comprehensive evaluation of the gate insulating film can be performed with the same circuit system. It should be noted that the semiconductor substrate on which these circuits are formed may partially have different constituent elements and may include portions having different crystal structures.

Hereinafter, the present technology will be described in detail.

Figure 2A:
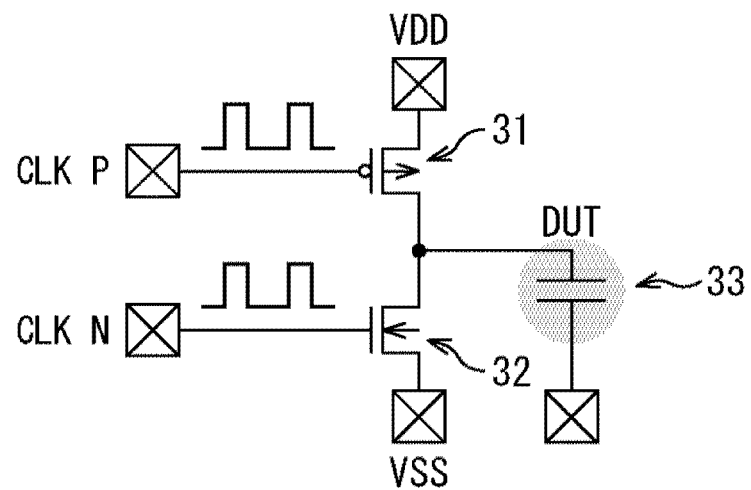
FIGS. 2A and 2B are diagrams illustrating a configuration example and a timing chart of a CBCM circuit.
Figure 2B:
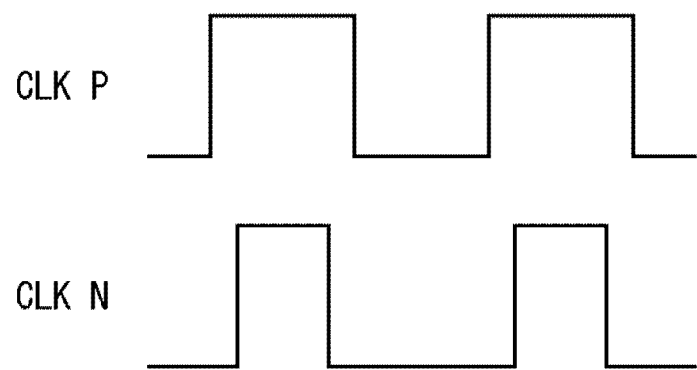

FIGS. 2A and 2B are diagrams illustrating a configuration example and a timing chart of the CBCM circuit 26 in FIG. 1. In the example of FIG. 2A, a configuration example of the CBCM circuit 26 is illustrated. In the example of FIG. 2A, a cross mark represents a terminal (pin).

In the CBCM circuit 26, a capacitance element to be measured, that is, a device under test (DUT) 33, is connected to the output of a measurement core circuit called a pseudo inverter including a PMISFET 31 and an NMISFET 32. Two non-overlapping clocks are input to the gates of the PMISFET 31 and the NMISFET 32 as illustrated in FIG. 2B. At that time, the charge/discharge current for the DUT 33 flows between VDD and VSS (GND) of the pseudo inverter. By monitoring this charge/discharge current, the DUT 33 can be measured.

In the example of FIG. 2B, a timing chart of the clock CLKP input to the P-MOS 31 of the CBCM circuit 26 and the clock CLKN input to the N-MOS 32 is illustrated.

The pulse distribution circuit 25 can distribute the clock CLKP and the clock CLKN so that the NMISFET 32 switches from OFF (0) to ON (VDD) after the PMISFET 31 switches from ON (0) to OFF (VDD) and that the PMISFET 31 switches from OFF (VDD) to ON (0) after the NMISFET 32 switches from ON (VDD) to OFF (0), that is, so that the PMISFET 31 and the N-MOS 32 do not turn ON at the same time. Then, the pulse distribution circuit 25 can output the clock CLKP and the clock CLKN to the CBCM circuit 26.

Figure 3A:
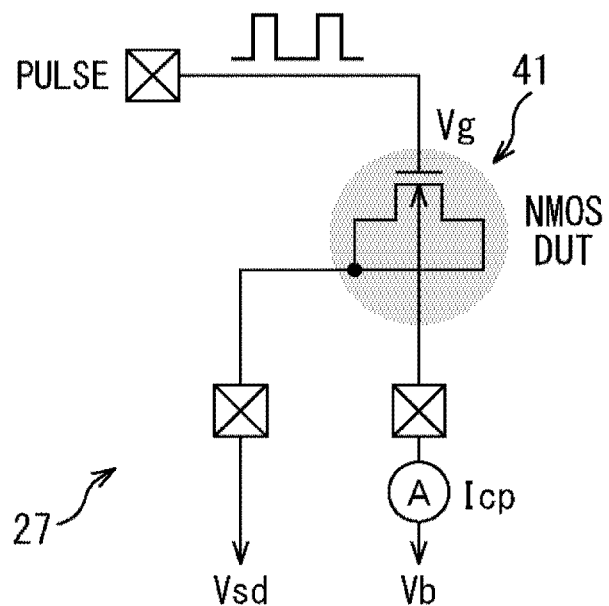
FIGS. 3A and 3B are diagrams illustrating a configuration example and a timing chart of a CP circuit.
Figure 3B:
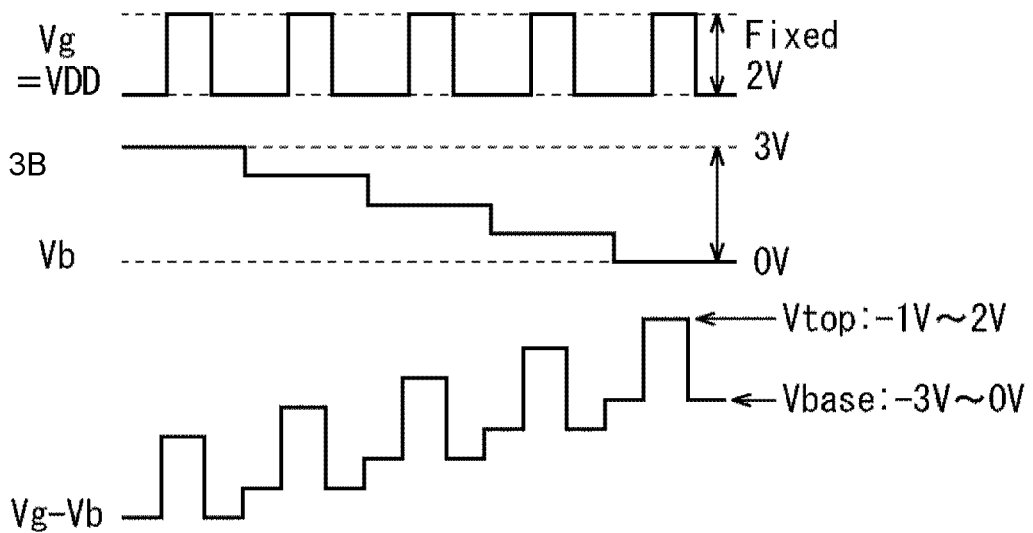

FIGS. 3A and 3B are diagrams illustrating a configuration example and a timing chart of the CP circuit 27. In the example of FIG. 3A, a configuration example of the CP circuit 27 is illustrated. In the example of FIG. 3A, a cross mark represents a terminal (pin).

The CP circuit 27 is a circuit that inputs, to the gate electrode of a MISFET (NMOS DUT) 41 to be measured, pulses that cause a channel to change from the accumulation state to the inverted state, and monitors, from the substrate side, the charge pumping current Icp (indicated by FIG. 3A) flowing through a trap acting as a recombination center of the gate insulating film and the semiconductor substrate interface. Note that in this example for measuring the charge ping current, as illustrated in FIG. 3A, the well of the gate insulating film is separated from the drain and the source, and separated from the wells of at least the pulse generation circuit 21, the control circuit 22, and the CBCM circuit 26.

In FIG. 3B, the pulse Vg input to the MISFET 41, the DC voltage (substrate side current) Vb which is changed by the step voltage, and the waveform (Vg-Vb) effectively acting on the oxide film are illustrated. That is, (Vg-Vb) represents the voltage of the oxide film.

FIG. 4 is a block diagram illustrating another configuration example of a semiconductor integrated circuit according to the present technology. In the example of FIG. 4, an example of the minimum configuration is illustrated.

The semiconductor integrated circuit 51 of FIG. 4 is identical to the semiconductor integrated circuit 11 of FIG.

1 in that it includes the pulse generation circuit 21, the pulse distribution circuit 25, the CBCM circuit 26, and the CP circuit 27. The semiconductor integrated circuit 51 of FIG. 4 is different from the semiconductor integrated circuit 11 of FIG. 1 in that the control circuit 22 and the PLL/DLL circuit 23 are eliminated.

That is, the semiconductor integrated circuit 51 of FIG. 4 is characterized in that the pulse generation circuit 21, the pulse distribution circuit 25, the CBCM circuit 26, and the CP circuit 27 (measured MISFET 41) are formed on the same semiconductor substrate, and that one pulse generation circuit 21 is shared by the CBCM method and the CP method. Note that two or more CBCM circuits 26 and two or more measured MISFETs 41 may be arranged in parallel.

Figure 5:
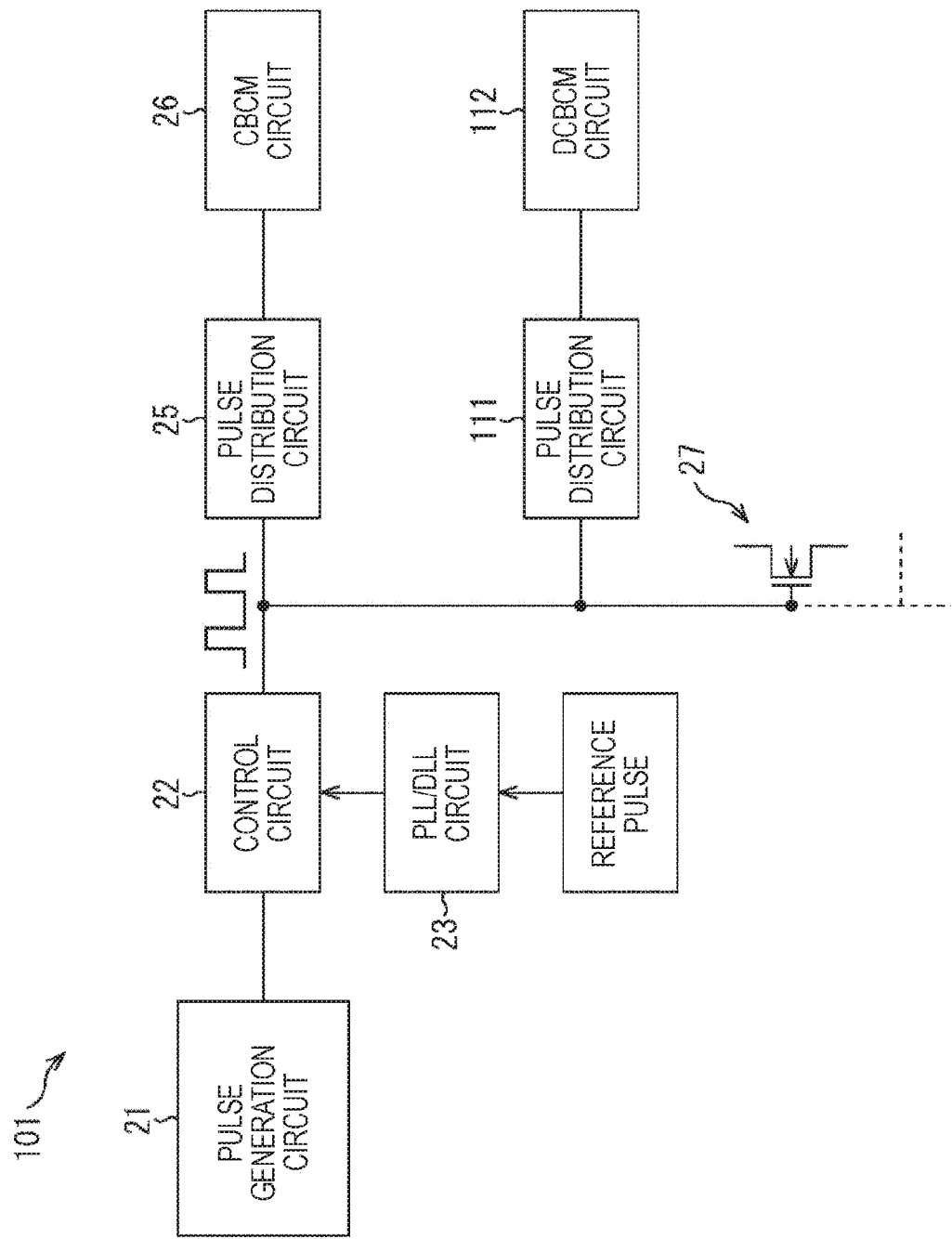
FIG. 5 is a block diagram illustrating another configuration example of a semiconductor integrated circuit according to the present technology.

FIG. 5 is a block diagram illustrating another configuration example of a semiconductor integrated circuit according to the present technology.

The semiconductor integrated circuit 101 of FIG. 5 is identical to the semiconductor integrated circuit 11 of FIG. 1 in that it includes the pulse generation circuit 21, the control circuit 22, the PLL/DLL circuit 23, the pulse distribution circuit 25, the CBCM circuit 26, and the CP circuit 27. The semiconductor integrated circuit 101 of FIG. 5 is different from the semiconductor integrated circuit 11 of FIG. 1 in that a pulse distribution circuit 111 and a difference charge-based capacitance measurement (DCBCM) circuit 112 are added.

The pulse distribution circuit 111 is basically configured in a manner similar to that for the pulse distribution circuit 25, divides one pulse into four pulses suitable for the DCBCM circuit 112, and outputs the four pulses to the DCBCM circuit 112. The DCBCM circuit 112 is configured to monitor a capacitance difference which is the output from a differential pair circuit in which two capacitance elements to be measured are connected.

Note that a combination example of the CBCM circuit 26, the DCBCM circuit 112, and the CP circuit 27 is illustrated in the example of FIG. 5. Alternatively, a combination of the CBCM circuit 26 and the DCBCM circuit 112 may be used, or a plurality of combinations thereof may be provided. Further, a combination of the DCBCM circuit 112 and the CP circuit 27 may be used, or a plurality of combinations thereof may be provided. Furthermore, these components are not necessarily combined, but a plurality of at least one of them may be provided. That is, the minimum configuration only needs to include at least one of the CBCM circuit 26 and the DCBCM circuit 112 as well as the CP circuit 27.

Figure 6:
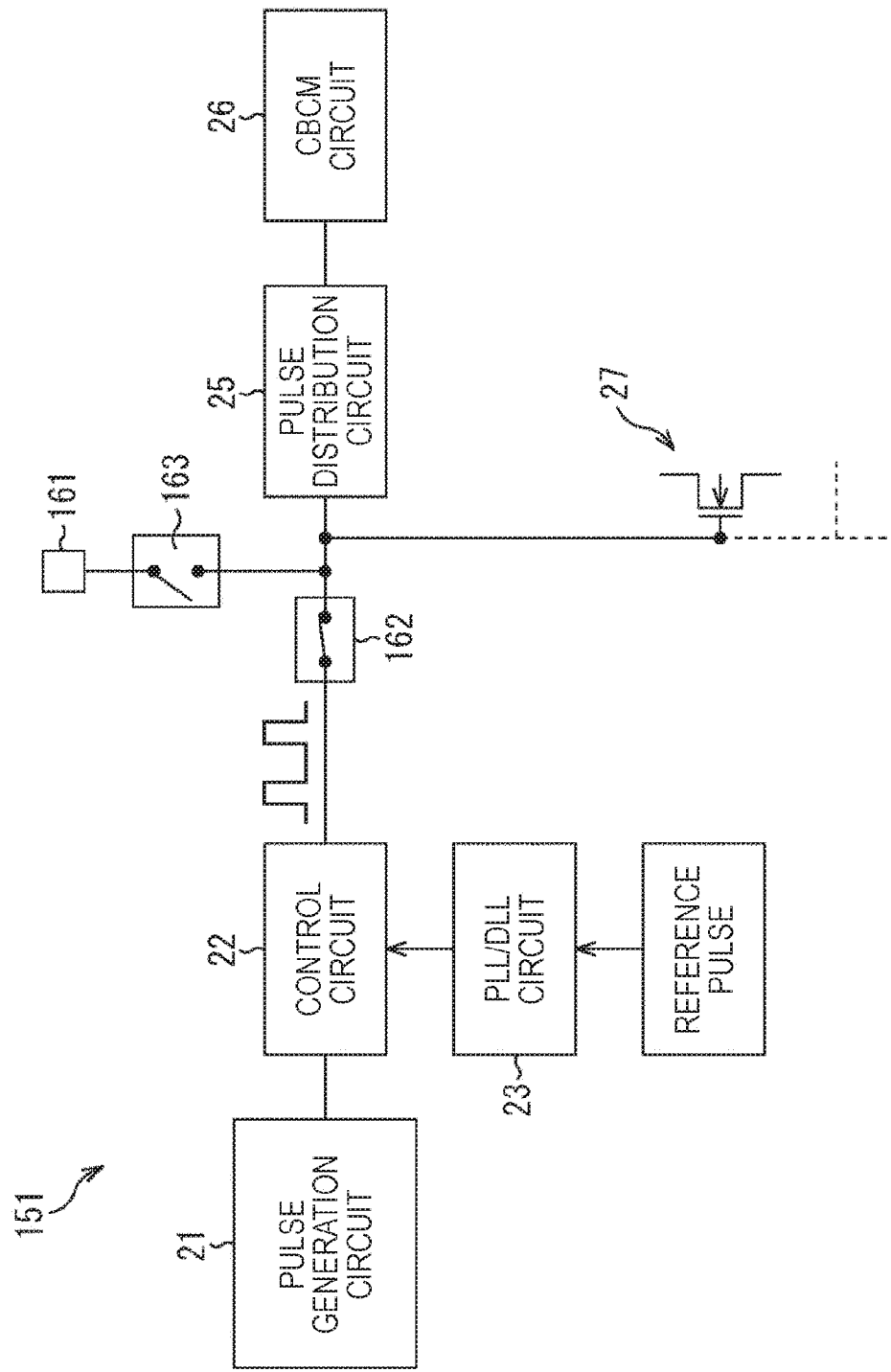
FIG. 6 is a block diagram illustrating another configuration example of a semiconductor integrated circuit according to the present technology.

FIG. 6 is a block diagram illustrating another configuration example of a semiconductor integrated circuit according to the present technology.

The semiconductor integrated circuit 151 of FIG. 6 is identical to the semiconductor integrated circuit 11 of FIG. 1 in that it includes the pulse generation circuit 21, the control circuit 22, the PLL/DLL circuit 23, the pulse distribution circuit 25, the CBCM circuit 26, and the CP circuit 27. The semiconductor integrated circuit 151 of FIG. 6 is different from the semiconductor integrated circuit 11 of FIG. 1 in that a DC voltage application terminal 161 and switches 162 and 163 are added.

Specifically, the DC voltage application terminal 161 is a terminal for applying a DC voltage to the gate electrode of the measured MISFET 41 of the CP circuit 27. The switches 162 and 163 are switches for switching between pulses from the pulse generation circuit 21 and pulses from the DC voltage application terminal 161.

With such a configuration, in the non-measurement MISFET 41, the gate voltage-drain current characteristic at the time of DC voltage application (hereinafter referred to as VgId) and VgId at the time of pulse application (hereinafter referred to as Pulsed VgId) can be compared in the same circuit (that is, semiconductor integrated circuit 151).

Figure 7:
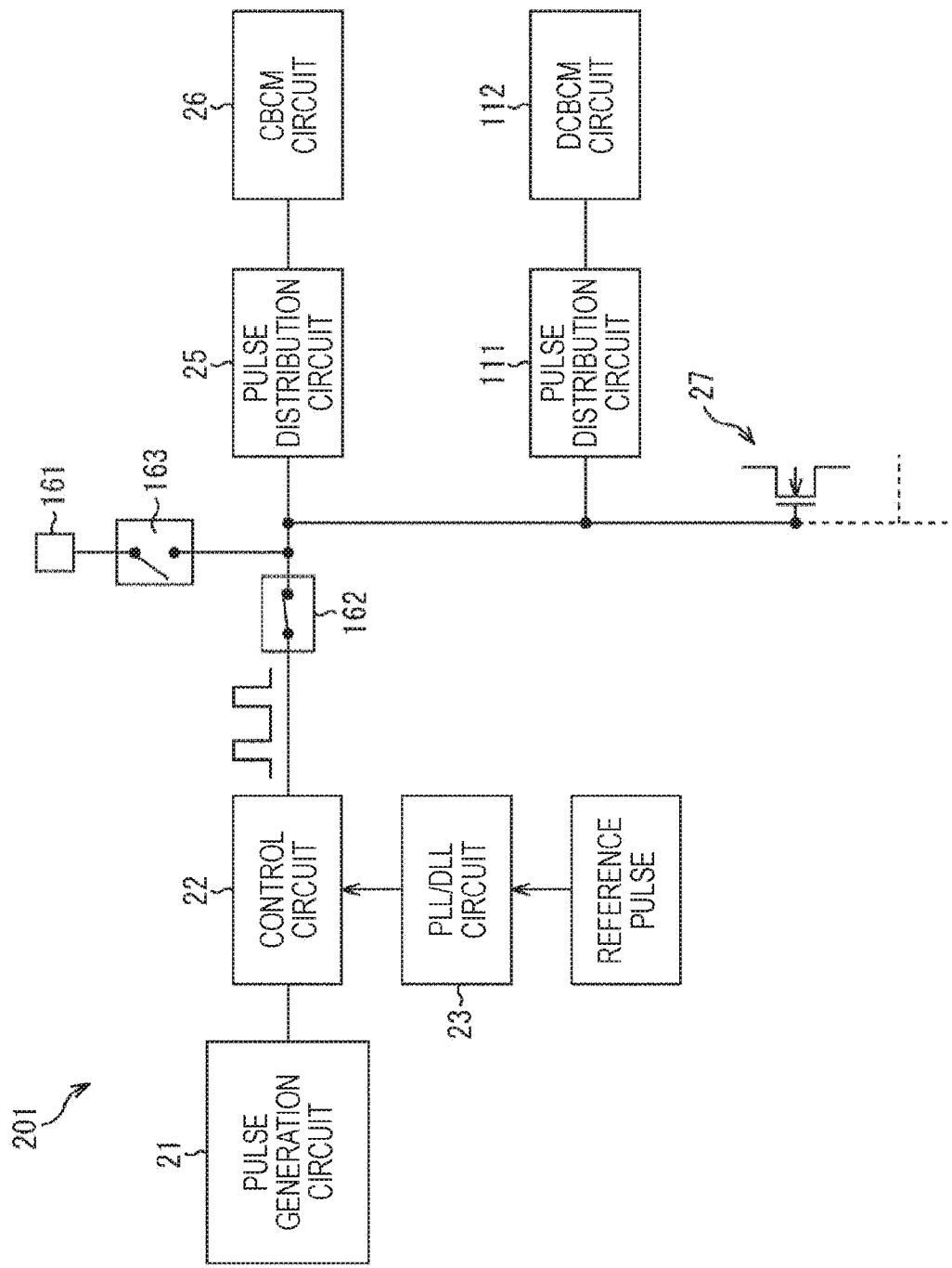
FIG. 7 is a block diagram illustrating another configuration example of a semiconductor integrated circuit according to the present technology.

FIG. 7 is a block diagram illustrating another configuration example of a semiconductor integrated circuit according to the present technology.

The semiconductor integrated circuit 201 of FIG. 7 is identical to the semiconductor integrated circuit 101 of FIG. 5 in that it includes the pulse generation circuit 21, the control circuit 22, the PLL/DLL circuit 23, the pulse distribution circuit 25, the CBCM circuit 26, the CP circuit 27, the pulse distribution circuit 111, and the DCBCM circuit 112.

The semiconductor integrated circuit 201 of FIG. 7 is different from the semiconductor integrated circuit 101 of FIG. 5 in that the DC voltage application terminal 161 and the switches 162 and 163 of FIG. 6 are added.

That is, the semiconductor integrated circuit 201 of FIG. 7 is a combination of the circuits in FIGS. 5 and 6.

Figure 8:
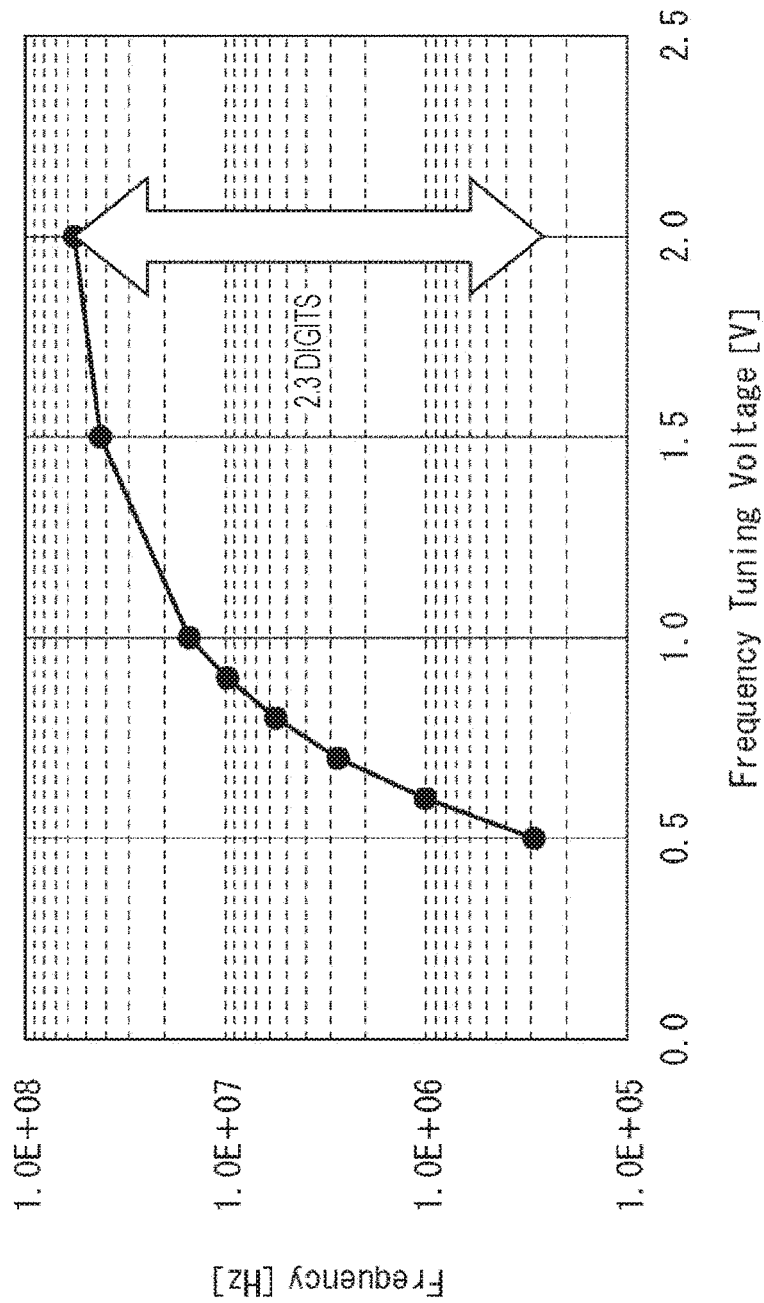
FIG. 8 is a diagram for explaining frequency modulation by a pulse generation circuit.

FIG. 8 is a diagram for explaining frequency modulation by the pulse generation circuit 21. In the example of FIG. 8, the vertical axis represents frequency, and the horizontal axis represents control voltage for frequency modulation. The pulse generation circuit 21 can be realized by a general oscillation circuit such as a voltage control oscillator (VCO), for example. As illustrated in FIG. 8, the oscillation frequency is modulated by two to three digits (2.3 digits in FIG. 8), so that the pulse generation circuit 21 can be shared by the CBCM method and the CP method having different optimum measurement frequencies.

Figure 9:
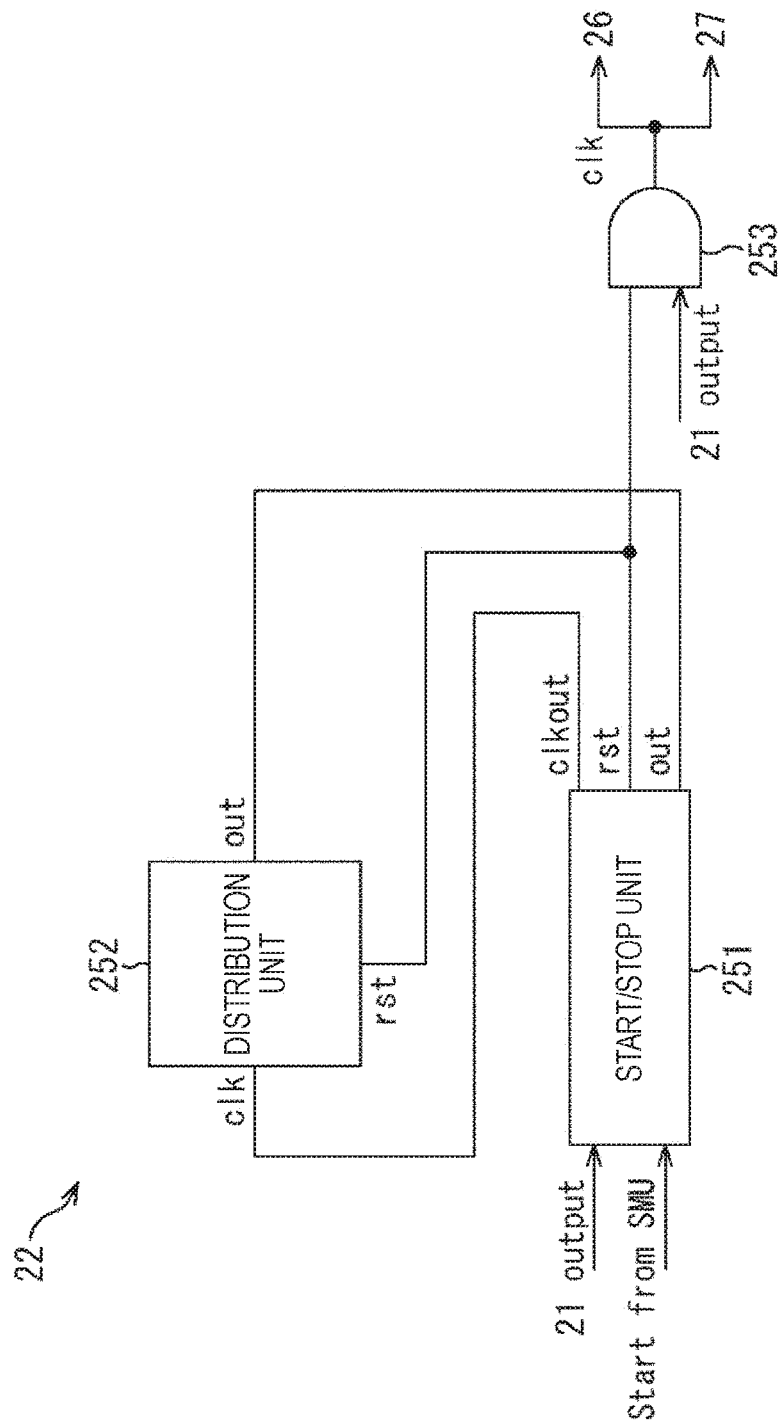
FIG. 9 is a circuit diagram illustrating a detailed configuration example of a control circuit.

FIG. 9 is a circuit diagram illustrating a detailed configuration example of the control circuit 22. Note that in practice, the circuit of the example of FIG. 9 includes not only the control circuit 22 but also the PLL/DLL circuit 23.

The control circuit 22 of FIG. 9 includes a start/stop unit 251, a distribution unit 252, and an AND circuit 253.

Pulses from the pulse generation circuit 21 and pulses with a slow frequency from the outside (Start from SMU) are input to the start/stop unit 251. Once a slow frequency comes in, the start/stop unit 251 starts oscillation in synchronization therewith. Once the slow frequency stops, the start/stop unit 251 stops oscillation in synchronization therewith. The distribution unit 252 counts pulses and outputs only the counted pulses at the timing of falling. The AND circuit 253 adds the pulses from the distributor 252 to the pulses from the pulse generation circuit 21, and outputs the result to the CBCM circuit 26 or the CP circuit 27.

Note that the configuration of the circuit is not limited to the configuration illustrated in FIG. 9 as long as the circuit controls the start and end of pulse input.

Figure 10:
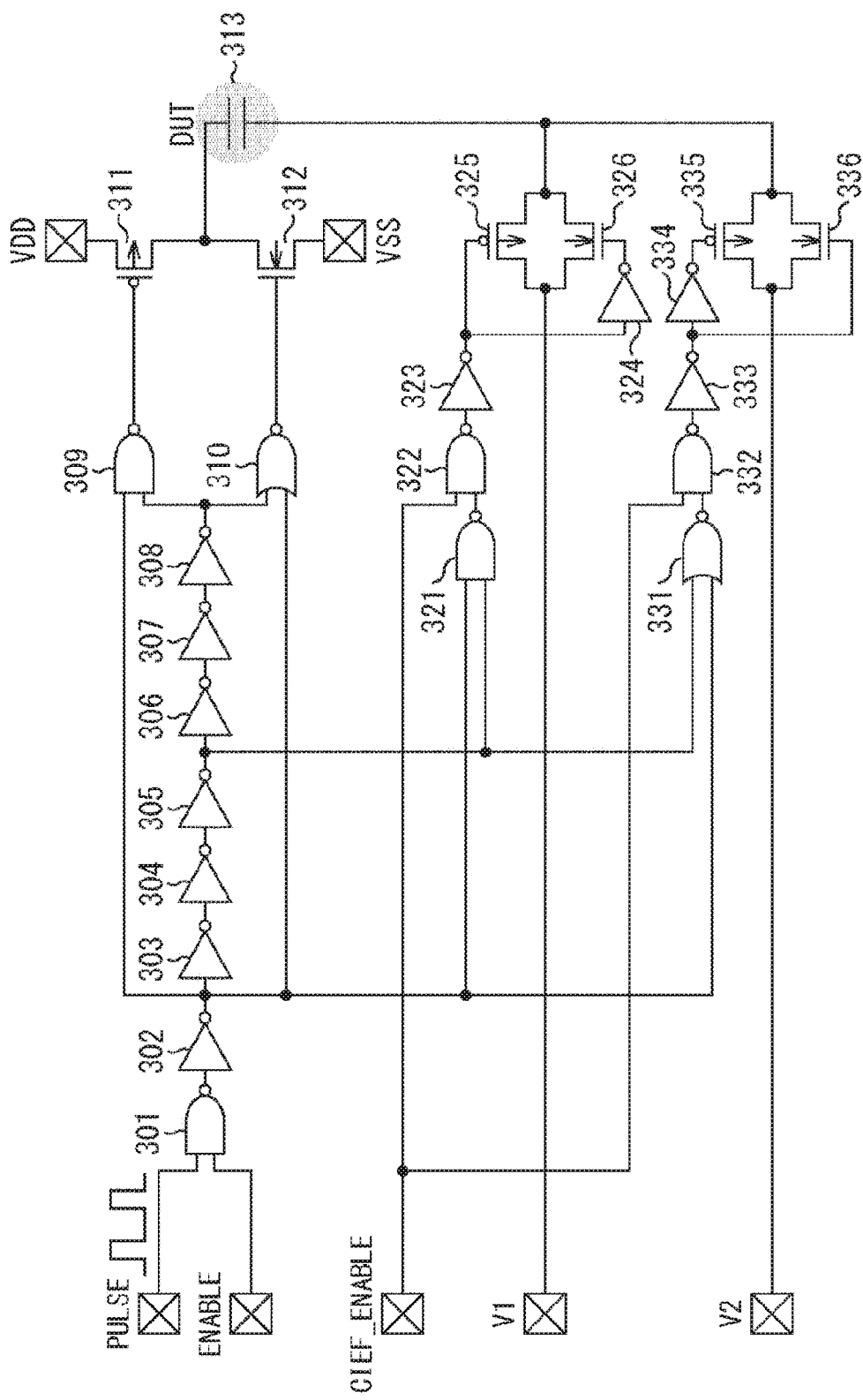
FIG. 10 is a circuit diagram illustrating a detailed configuration example of a pulse distribution circuit.

FIG. 10 is a circuit diagram illustrating a detailed configuration example of the pulse distribution circuit 25. Note that in the example of FIG. 10, one pulse branches into three pulses.

The pulse distribution circuit 25 causes one pulse to branch into three pulses. The pulse distribution circuit 25 includes a NAND circuit 301, inverters 302 to 308, a NAND circuit 309, a NOR circuit 310, a P-MOS 311, an N-MOS 312, and a DUT 313. Further, the pulse distribution circuit 25 includes a NAND circuit 321, a NAND circuit 322, an inverter 323, an inverter 324, a P-MOS 325, an N-MOS 326, a NOR circuit 331, an NAND circuit 332, an inverter 333, an inverter 334, a P-MOS 335, and an N-MOS 336.

Figure 11:
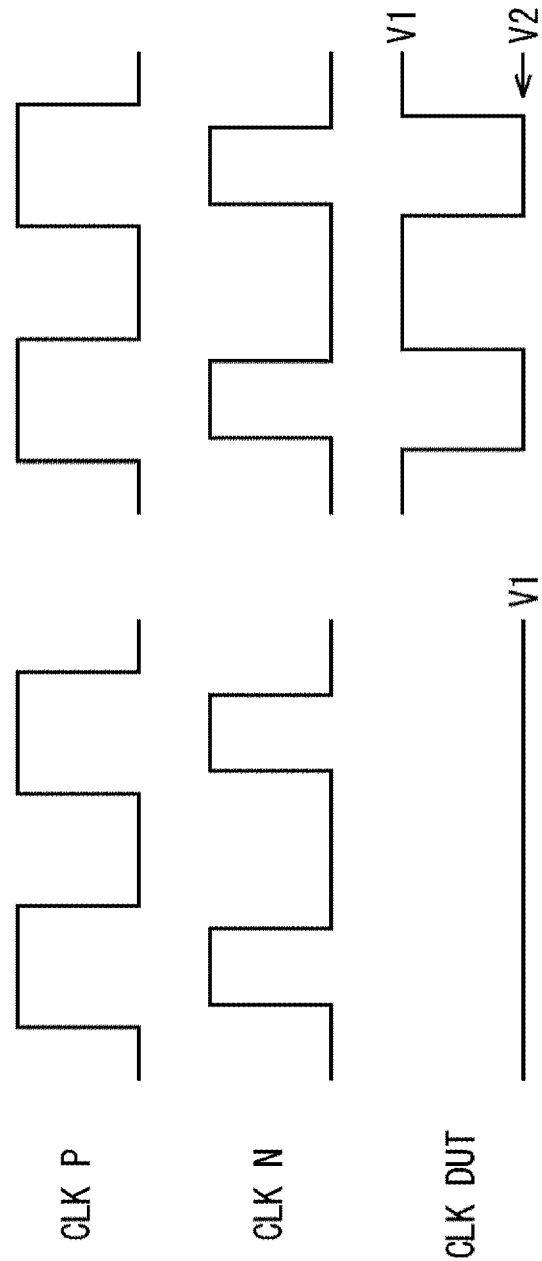
FIGS. 11A and 11B are diagrams illustrating a timing chart of the pulse distribution circuit.

Pulses from the pulse generation circuit 21 and a selection signal (enable) are input to the NAND circuit 301, and CLKP and CLKN are output from the NAND circuit 301 to the capacitor 313 as illustrated in A of FIG. 11A or FIG. 11B.

A transfer gate is formed by each of the P-MOS 325 and the N-MOS 326 and the P-MOS 335 and the N-MOS 336. The voltages V1 and V2 are input to the respective transfer gates, whereby CLK DUT is output as illustrated in FIG. 11B.

Note that the pulse distribution circuit 25 of FIG. 10 can output two clocks CLKP and CLKN as illustrated in FIG. 11A by setting CIEF_ENABLE to LOW, and output three clocks CLKP, CLKN, and CLKDUT as illustrated in FIG. 11B by setting CIEF_ENABLE to HIGH.

Note that the circuit configuration of FIG. 10 is an example, and the configuration of the circuit is not limited to the configuration of FIG. 10 as long as the circuit causes a pulse to branch into two or more non-overlapping pulses.

Figure 12:
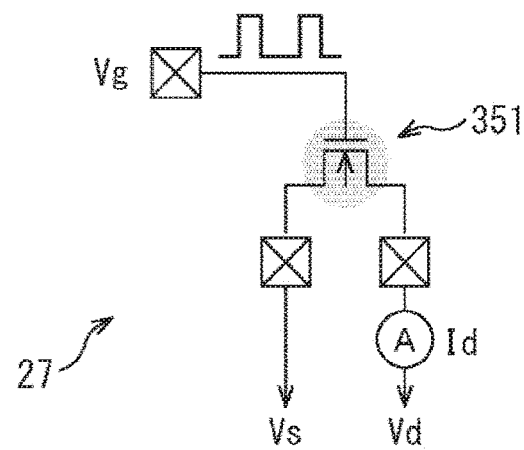
FIG. 12 is a circuit diagram illustrating a configuration example of the CP circuit for monitoring Pulsed VgId.

FIG. 12 is a circuit diagram illustrating an example of monitoring Pulsed VgId in the CP circuit.

In the CP circuit 27 of FIG. 12, the pulse Vg is input to the gate of a MISFET 351, the Vs voltage is applied to the source of the MISFET 351, and the Vd voltage is applied to the drain of the MISFET 351. The current Id is monitored on the drain side, so that Pulsed VgId can be monitored. In this example of monitoring (measuring) Pulsed VgId, as illustrated in the circuit of FIG. 12, the drain, the source, and the well terminal are separated in the non-measurement MISFET 351.

Figure 13A:
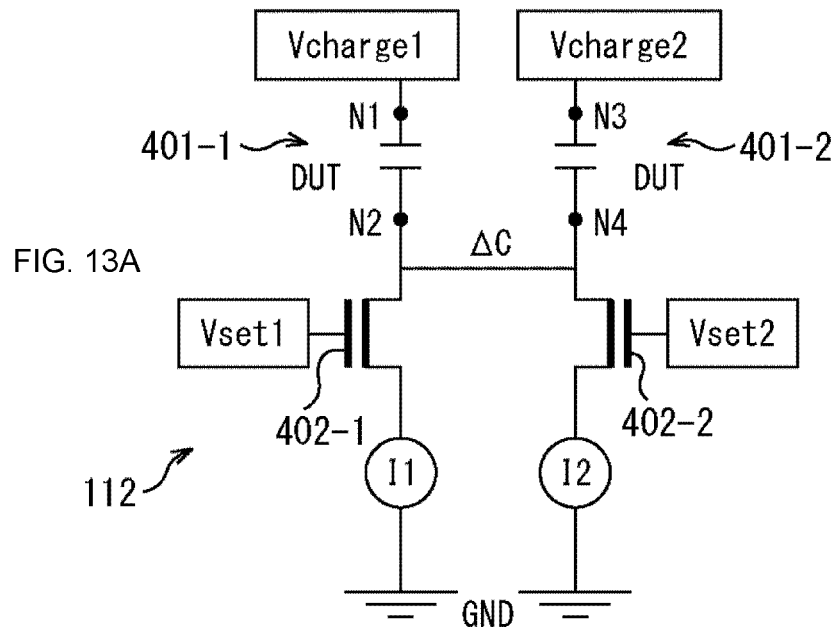
FIGS. 13A and 13B are diagrams illustrating a configuration example and a timing chart of a DCBCM circuit according to the present technology.
Figure 13B:
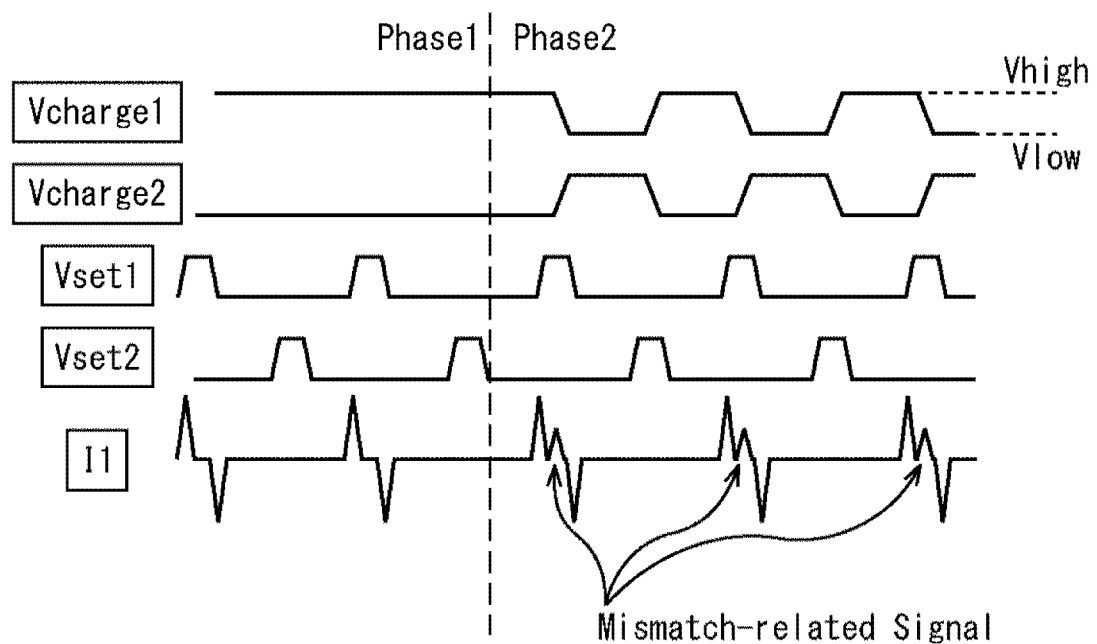

FIGS. 13A and 13B are circuit diagrams illustrating a configuration example of the DCBCM circuit according to the present technology.

In the example of FIGS. 13A and 13B, the DCBCM circuit 112 is a differential pair circuit including DUT 401-1 and Tr 402-1 connected to VDD that applies Vcharge1, DUT 401-2 and Tr 402-2 pared therewith and connected to VDD that applies Vcharge2, and an output unit 24.

In the DCBCM circuit 112, capacitors (MOS-C (gate capacitor), MIS-C (MIS type), Comb-C (MOM type wiring), etc.) are arranged as the DUT 401-1 and the DUT 401-2. The Tr 402-1 and the Tr 402-2 are transistors, and the pulses Vset1 and Vset2 are applied to the Tr 402-1 and the Tr 402-2, respectively. At least one of I1 and I2 is monitored.

As illustrated in the timing chart of FIG. 13B, Phase 1 is a phase for clearing the parasitic capacitance, and Phase 2 is a phase for actually obtaining the capacitance difference. In FIG. 13B, the pulses Vcharge1, Vcharge2, Vset1, and Vset2 are applied. Vcharge1 and Vcharge2 are alternately inverted signals input to the charge/discharge input terminals. Vset1 and Vset2 are control signals input to the gate electrodes. Vcharge1 and Vcharge2 perform charging and discharging such that when one is on, the other is off. At the time of switching (at the time of inversion), a current corresponding to the difference flows at the edge. The output I1 is proportional to the capacitance value difference between the DUT 401-1 and the DUT 401-2, and the capacitance value difference between the DUT 401-1 and the DUT 401-2 can be obtained using $\Delta C=\Delta I/(VDD*f)$. Note that f is input pulse frequency.

The capacitance value difference between the DUT 401-1 and the DUT 401-2 is measured by monitoring I1 or I2.

It is to be noted that the capacitor to be measured with the CBCM method or the DCBCM method in this specification is not necessarily a gate insulating film, but may be a parasitic capacitance unit such as various capacitance elements or inter-wiring capacitors.

As described above, according to the semiconductor integrated circuit of the present technology, the measurement accuracy can be improved as compared with the case of independently performing measurement with the CBCM method and measurement with the CP method. In addition, by sharing the pulse generation circuit 21, the control circuit 22, and the pulse distributor 25 with a plurality of gate insulating films to be measured, it is possible to reduce the mounting area and the number of PADs. This makes it easier to mount them in a product chip, so that the chip-by-chip characteristic can be obtained, and the efficiency of characteristic analysis can be improved.

Evaluation can be conducted with a general-mass production test system, and the effect of reducing equipment installation costs for pulse generators and frequency measuring instruments can be obtained. In addition, parallel simultaneous measurement with the CBCM method and the CP method can be performed by installing measurement terminals for a plurality of gate insulating films to be measured. The test time is shortened as compared with the case of independent testing, so that the effect of test cost reduction can be obtained.

Further, the pulse generation circuit 21, the control circuit 22, and the pulse distributor 25 are formed on the same semiconductor substrate as a plurality of gate insulating films to be measured, and the CP measurement method is applied with internal pulses by applying a DC bias to the substrate side of the non-measurement gate insulating film in a controllable manner. As a result, the CBCM method and the CP method can be simultaneously realized in the same circuit system, and the comprehensive evaluation of the gate insulating film can be performed just with the circuit of the present technology.

Note that the system as used in the present specification represents an entire apparatus including a plurality of devices (apparatuses).

In addition, the embodiments in the present disclosure are not limited to the above-mentioned embodiments, and can be variously changed in a range not departing from the gist of the present disclosure.

In addition, the configuration described above as a single apparatus (or processing unit) may be divided and configured as a plurality of apparatuses (or processing units). To the contrary, the configuration described above as a plurality of apparatuses (or processing units) may be combined and configured as a single apparatus (or processing unit). In addition, needless to say, a configuration other than the above-mentioned configuration may be added to the configuration of each apparatus (or each processing unit). Furthermore, as long as the configuration and the operation of the system as a whole are substantially the same, a part of the configuration of a certain apparatus (or processing unit) may be included in the configuration of another apparatus (or another processing unit). In other words, the present technology is not limited to the above-mentioned embodiments, and can be variously changed in a range not departing from the gist of the present technology.

The preferable embodiments of the present disclosure have been described so far in detail with reference to the accompanying drawings. However, the disclosure is not limited to these examples. It is obvious that various types of variations or modifications can be conceived in a range of the technical idea described in the claims if a person has ordinary knowledge of the technical filed to which the present disclosure belongs. It is naturally understood that these variations or modifications also belong to the technical range of the present disclosure.

Note that the present technology can also be configured as follows.

(1) A semiconductor integrated circuit including:
a pulse generation circuit capable of frequency modulation;

at least one of: at least one or more charge-based capacitance measurement (CBCM) circuits; and at least one or more difference CBCM (DCBCM) circuits, the CBCM circuit and the DCBCM circuit being preceded by a circuit that causes an output pulse from the pulse generation circuit to branch into at least two or more pulses that do not overlap with each other, the CBCM circuit and the DCBCM circuit receiving branch input of the output pulse from the pulse generation circuit; and at least one or more non-measurement metal insulator semiconductor field effect transistors (MISFETs) having a gate electrode that receives branch input of the output pulse from the pulse generation circuit.

(2) The semiconductor integrated circuit according to (1), in which the pulse generation circuit, the circuit, and the non-measurement MISFET are formed on the same semiconductor substrate.

(3) The semiconductor integrated circuit according to (1) or (2), further including:

a control circuit that controls generation and disconnection of a certain number of pulses using a reference pulse input from the outside as a trigger; and a phase locked loop (PLL) circuit or a digital locked loop (DLL) circuit that performs phase synchronization on the reference pulse.

(4) The semiconductor integrated circuit according to (3), further including a switch that switches between DC voltage from a DC voltage application terminal and pulse input from the pulse generation circuit.

(5) The semiconductor integrated circuit according to any of (1) to (4), in which in a case where the CBCM circuit is provided, in the CBCM circuit, after branching into at least three or more pulses that do not overlap with each other in a former stage circuit, one of the pulses is input to a PMISFET of a pseudo inverter, one of the pulses is input to an NMISFET of the pseudo inverter, and one of the pulses is input to a counter electrode of a measurement target capacitor.

(6) The semiconductor integrated circuit according to any of (1) to (5), in which in a case where the DCBCM circuit is provided, in the DCBCM circuit, after branching into four pulses that do not overlap each other in a former stage circuit, the pulses are input to two charge/discharge input terminals and two gate electrodes in a controllable manner.

(7) The semiconductor integrated circuit according to any of (1) to (6), in which in a case where a charge pumping current is measured in a gate insulating film of the non-measurement MISFET, a well of the gate insulating film is separated from a drain and a source, and separated from wells of at least the pulse generation circuit, the control circuit, and the circuit.

(8) The semiconductor integrated circuit according to any of (1) to (7), in which in the non-measurement MISFET, a drain, a source, and a well terminal are separated.

(9) The semiconductor integrated circuit according to any of (1) to (8), in which the pulse generation circuit includes a ring oscillator circuit.

(10) The semiconductor integrated circuit according to any of (1) to (9), in which when measuring a charge pumping current of the non-measurement MISFET, the charge pumping current is measured by making a well voltage of the non-measurement MISFET larger than a gate pulse voltage to control an effective gate voltage to a negative voltage.

(11) A signal processing method including, by a semiconductor integrated circuit:

branch-inputting an output pulse from a pulse generation circuit capable of frequency modulation to at least one of: at least one or more CBCM circuits; and at least one or more DCBCM circuits, the CBCM circuit and the DCBCM circuit being preceded by a circuit that causes the output pulse from the pulse generation circuit to branch into at least two or more pulses that do not overlap with each other; and branch-inputting the output pulse from the pulse generation circuit to at least one or more non-measurement MISFETs having a gate electrode.

REFERENCE SIGNS LIST

11 Semiconductor integrated circuit
21 Pulse generation circuit
22 Control circuit
23 PLL/DLL circuit
25 Pulse distribution circuit
26 CBCM circuit
27 CP circuit
31 PMISFET
32 NMISFET
33 DUT
41 MISFET
51 Semiconductor integrated circuit
101 Semiconductor integrated circuit
111 Pulse distribution circuit
112 DCBCM circuit
151 Semiconductor integrated circuit
161 DC voltage application terminal
162, 163 Switch
201 Semiconductor integrated circuit
251 Start/stop unit
252 Distribution unit
253 AND circuit
351 MISFET
401-1, 401-2 DUT
402-1, 402-2 Tr

The invention claimed is:

1. A semiconductor integrated circuit, comprising:
a pulse generation circuit configured to:
   generate a pulse; and
   output the generated pulse;
a first pulse distribution circuit configured to branch the output pulse into at least two non-overlapping pulses;
at least one of:
   at least one charge-based capacitance measurement (CBCM) circuit configured to receive the at least two non-overlapping pulses; or
   at least one difference CBCM (DCBCM) circuit,
wherein
   the at least one CBCM circuit is connected to the first pulse distribution circuit; and
at least one non-measurement metal insulator semiconductor field effect transistor (MISFET) having a gate electrode, wherein the gate electrode is configured to receive a branch input of the output pulse from the pulse generation circuit.

2. The semiconductor integrated circuit according to claim 1, wherein
the pulse generation circuit, the first pulse distribution circuit, and the at least one non-measurement MISFET are on the same semiconductor substrate.

3. The semiconductor integrated circuit according to claim 2, further comprising:
a control circuit configured to control generation and disconnection of a specific number of pulses based on a reference pulse input from outside as a trigger; and
one of a phase locked loop (PLL) circuit or a digital locked loop (DLL) circuit configured to execute a phase synchronization on the reference pulse.

4. The semiconductor integrated circuit according to claim 2, further comprising
a switch configured to switch between a DC voltage from a DC voltage application terminal and a pulse input from the pulse generation circuit.

5. The semiconductor integrated circuit according to claim 2, wherein
the at least one CBCM circuit includes a pseudo inverter and a measurement target capacitor,
after the output pulse is branched into at least three non-overlapping pulses in a former stage circuit, one of the at least three non-overlapping pulses is input to a PMISFET of the pseudo inverter,
one of the at least three non-overlapping pulses is input to an NMISFET of the pseudo inverter, and
one of the at least three non-overlapping pulses is input to a counter electrode of the measurement target capacitor.

6. The semiconductor integrated circuit according to claim 2, wherein, after the output pulse is branched into four non-overlapping pulses in a former stage circuit, the four non-overlapping pulses are respectively input to two charge/discharge input terminals and two gate electrodes of the DCBCM circuit in a controllable manner.

7. The semiconductor integrated circuit according to claim 2, wherein
the semiconductor integrated circuit is configured to measure a charge pumping current in a gate insulating film of the at least one non-measurement MISFET, in a state in which:
a well of the gate insulating film is separated from a drain of the at least one non-measurement MISFET and a source of the at least one non-measurement MISFET; and
the well of the gate insulating film is separated from a well of the pulse generation circuit, a well of a control circuit, and a well of the first pulse distribution circuit.

8. The semiconductor integrated circuit according to claim 2, wherein
the at least one non-measurement MISFET includes a drain, a source, and a well terminal, and
each of the drain, the source, and the well terminal are separated from one another.

9. The semiconductor integrated circuit according to claim 1, wherein the pulse generation circuit includes a ring oscillator circuit.

10. The semiconductor integrated circuit according to claim 1, wherein
the semiconductor integrated circuit is configured to measure a charge pumping current of the at least one non-measurement MISFET based on:
control of a well voltage of the at least one non-measurement MISFET to be larger than a gate pulse voltage, and
control of an effective gate voltage to be a negative voltage.

11. A signal processing method, comprising:
in a signal processing circuit:
generating, by a pulse generation circuit, a pulse;
outputting, by the pulse generation circuit, the generated pulse;
branching, by a pulse distribution circuit, the output pulse into at least two non-overlapping pulses;
receiving, by one of at least one charge-based capacitance measurement (CBCM) circuit or at least one difference CBCM (DCBCM) circuit, the at least two non-overlapping pulses, wherein
the at least one CBCM circuit is connected to the pulse distribution circuit; and
receiving, by a gate electrode of at least one non-measurement metal insulator semiconductor field effect transistor (MISFET), a branch input of the output pulse from the pulse generation circuit.

12. A semiconductor integrated circuit, comprising:
a pulse generation circuit configured to modulate frequency;
at least one of:
at least one charge-based capacitance measurement (CBCM) circuit; or
at least one difference CBCM (DCBCM) circuit, wherein
the CBCM circuit and the DCBCM circuit are preceded by a circuit that causes an output pulse from the pulse generation circuit to branch into at least two non-overlapping pulses, and
the at least one of the at least one CBCM circuit or the at least one DCBCM circuit is configured to receive a branch input of the output pulse from the pulse generation circuit; and
at least one non-measurement metal insulator semiconductor field effect transistor (MISFET) having a gate electrode, wherein
the gate electrode is configured to receive the branch input of the output pulse from the pulse generation circuit,
the pulse generation circuit, the circuit, and the at least one non-measurement MISFET are on the same semiconductor substrate,
the CBCM circuit comprises a pseudo inverter and a measurement target capacitor, and
in a case where the CBCM circuit is provided, after the output pulse is branched into at least three non-overlapping pulses in the circuit, a first of the at least three non-overlapping pulses is input to a PMISFET of the pseudo inverter, a second of the at least three non-overlapping pulses is input to an NMISFET of the pseudo inverter, and a third of the at least three non-overlapping pulses is input to a counter electrode of the measurement target capacitor.

* * * * *